(12) United States Patent
Meyer et al.

(10) Patent No.: US 8,974,914 B2
(45) Date of Patent: Mar. 10, 2015

(54) METAL-CERAMIC SUBSTRATE AND METHOD FOR MANUFACTURING SUCH A SUBSTRATE

(75) Inventors: Andreas Meyer, Wenzenbach (DE); Jürgen Schulz-Harder, Lauf (DE)

(73) Assignee: Rogers Germany GmbH, Eschenbach (DE)

( * ) Notice: Subject to any disclaimer, the term of this patent is extended or adjusted under 35 U.S.C. 154(b) by 54 days.

(21) Appl. No.: 13/279,701

(22) Filed: Oct. 24, 2011

(65) Prior Publication Data
US 2012/0107642 A1 May 3, 2012

(30) Foreign Application Priority Data
Oct. 27, 2010 (DE) .......................... 10 2010 049 499

(51) Int. Cl.
| | | |
|---|---|---|
| B32B 15/04 | (2006.01) |
| C04B 37/00 | (2006.01) |
| B82Y 30/00 | (2011.01) |
| C04B 35/634 | (2006.01) |
| C04B 37/02 | (2006.01) |
| H01L 23/373 | (2006.01) |

(52) U.S. Cl.
CPC .............. *C04B 37/006* (2013.01); *B82Y 30/00* (2013.01); *C04B 35/63452* (2013.01); *C04B 37/021* (2013.01); *C04B 37/026* (2013.01); *C04B 37/028* (2013.01); *H01L 23/3735* (2013.01); *C04B 2235/5248* (2013.01); *C04B 2235/5288* (2013.01); *C04B 2237/121* (2013.01); *C04B 2237/124* (2013.01); *C04B 2237/343* (2013.01); *C04B 2237/348* (2013.01); *C04B 2237/366* (2013.01); *C04B 2237/368* (2013.01); *C04B 2237/40* (2013.01); *C04B 2237/402* (2013.01); *C04B 2237/407* (2013.01); *C04B 2237/62* (2013.01); *C04B 2237/68* (2013.01); *C04B 2237/708* (2013.01); *C04B 2237/72* (2013.01)
USPC ....................................... 428/622

(58) Field of Classification Search
None
See application file for complete search history.

(56) References Cited

U.S. PATENT DOCUMENTS

| | | | | |
|---|---|---|---|---|
| 5,191,174 | A * | 3/1993 | Chang et al. ................... | 174/266 |
| 5,903,583 | A * | 5/1999 | Ullman et al. .................. | 372/35 |
| 2006/0269765 | A1* | 11/2006 | Collier et al. ................. | 428/469 |
| 2009/0232972 | A1 | 9/2009 | Schulz-Harder | |
| 2011/0274888 | A1* | 11/2011 | Tang et al. .................... | 428/189 |

FOREIGN PATENT DOCUMENTS

WO    WO2010/049771    5/2010

OTHER PUBLICATIONS

Batlow, Fred D., "Ceramic Interconnect Technology Handbook", CRC Press, 2007, pp. 341-342.

* cited by examiner

*Primary Examiner* — Adam Krupicka
(74) *Attorney, Agent, or Firm* — Welsh Flaxman & Gitler LLC

(57) ABSTRACT

A metal-ceramic substrate for electrical circuits or modules includes at least one first outer metal layer forming one first surface side of the metal-ceramic substrate and at least one second outer metal layer forming one second surface side of the metal-ceramic substrate. The outer metal layers are bonded respectively by two-dimensional bonding with the surface sides of a plate-like substrate body.

13 Claims, 5 Drawing Sheets

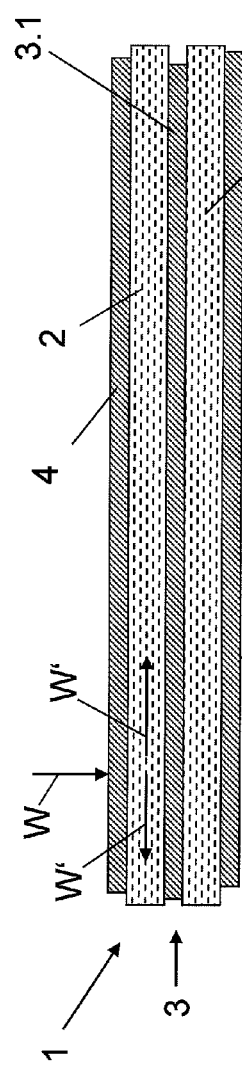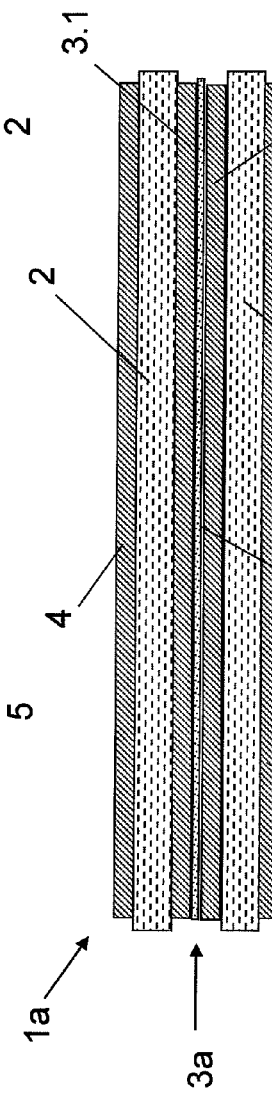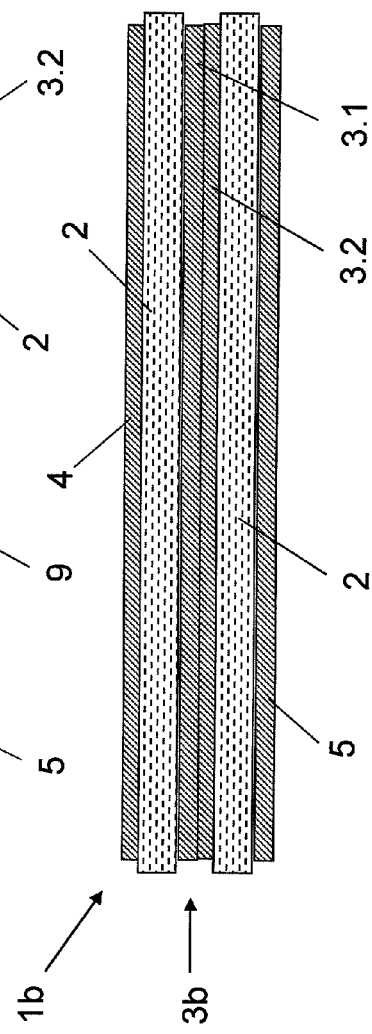

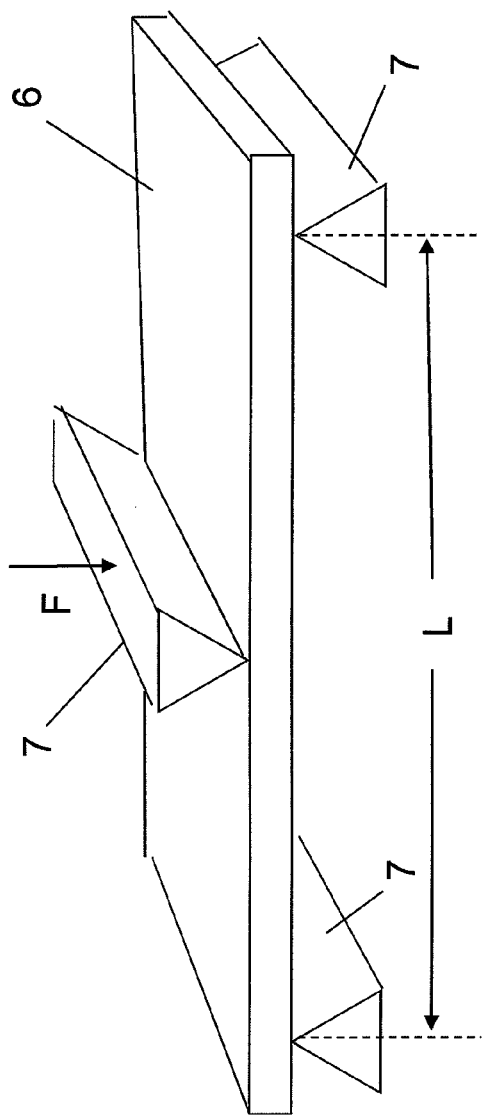
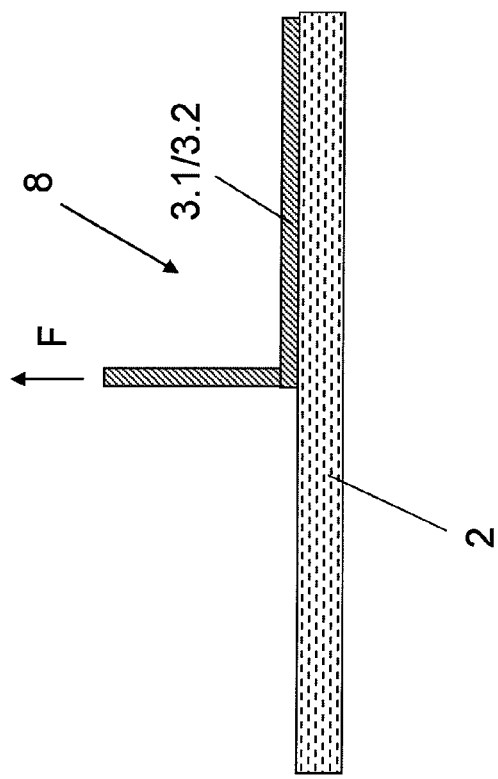

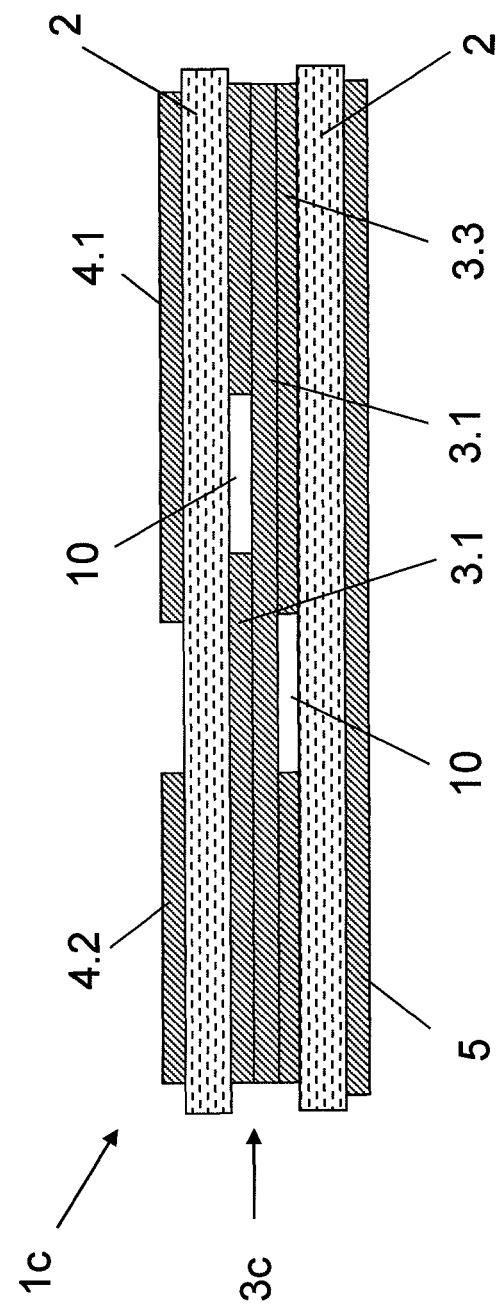

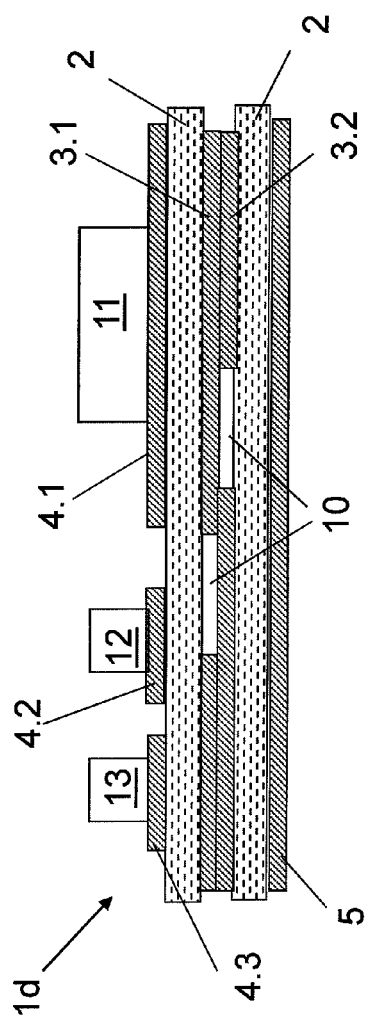
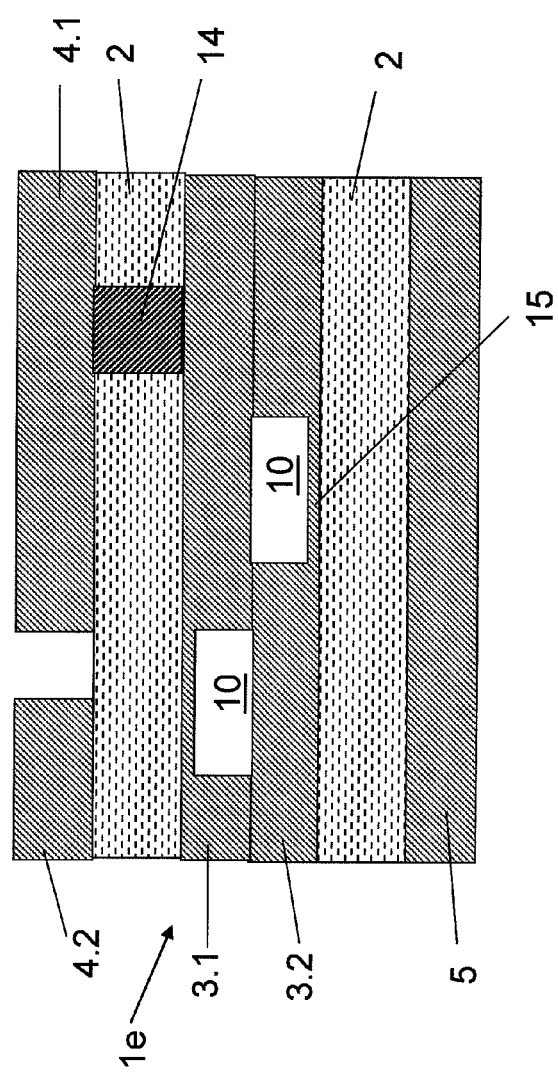

METAL-CERAMIC SUBSTRATE AND METHOD FOR MANUFACTURING SUCH A SUBSTRATE

BACKGROUND OF THE INVENTION

The invention relates to a metal-ceramic substrate and a method of making a metal-ceramic substrate. The substrate is made up of at least two ceramic layers and a layer separating the two ceramic layers made up of metal.

Metal-ceramic substrates for electric and electronic circuits or modules, i.e., and particularly printed circuit boards for such circuits or modules, are known in different embodiments.

Also known is the "DCB process" (Direct Copper Bond technology), hereinafter also referred to as DCB bonding, which is used to bond metal layers or sheets (e.g. copper sheets or foils) with each other and/or with ceramic or ceramic layers, namely using metal or copper sheets or foils, which are provided on their surfaces with a layer or coating (hot-melt layer) resulting from a chemical bond between the metal and a reactive gas, preferably oxygen. In this method, which is described, for example, in U.S. Pat. No. 3,744,120 and in DE-PS 23 19 854, this layer or coating (hot-melt layer) forms a eutectic with a melting temperature below the melting temperature of the metal (e.g. copper), so that the layers can be bonded to each other by placing the foil on the ceramic and heating all layers, by melting the metal or copper essentially only in the area of the hot-melt layer or oxide layer.

This DCB process includes the following steps:
oxidation of a copper foil so as to produce an even copper oxide layer;
placing the copper foil on the ceramic layer;
heating the composite to a process temperature between approx. 1025 and 1083° C., e.g. to approx. 1071° C.; and
cooling to room temperature.

Also known is the so-called active soldering method (DE 22 13 115, EP-A-153 618) for bonding metal layers or metal foils, in particular copper layers or copper foils, with ceramic material. In this process, which is used especially for manufacturing a metal-ceramic substrate, a bond is produced at a temperature of ca. 800-1000° C. between a metal foil, for example a copper foil, and a ceramic substrate, for example aluminum-nitride ceramic, using a hard solder, which in addition to a main component such as copper, silver and/or gold also contains an active metal. This active metal is at least one element of the group Hf, Ti, Zr, Nb, Ce, creates a bond between the solder and the ceramic through a chemical reaction, while the bond between the solder and the metal is a metallic hard solder bond.

"Bonding" as used in the invention means generally connecting, e.g. DCB bonding, active soldering, hard soldering, adhesive bonding, etc.

The term "essentially" as used in the invention means deviations from the exact value by +/−10%, preferably by +/−5% and/or deviations in the form of changes that are insignificant for the function.

It is an object of the invention is to present a metal-ceramic substrate with improved mechanical, thermal and electrical properties.

SUMMARY OF THE INVENTION

The metal-ceramic substrate according to the invention, in a preferred embodiment, comprises at least two ceramic layers separated from each other by an intermediate layer. The ceramic layers are made, for example, of $Al_2O_3$, $Al_2O_3$-$ZrO_2$, AlN and/or $Si_3N_4$ and are separated from each other by an intermediate layer. The intermediate layer comprises at least one inner metal layer adjacent to both ceramic layers or at least two inner metal layers respectively adjacent to one ceramic layer. The respective inner metal layer is connected with the ceramic layer so that an adhesive or peel strength between the inner metal layer and the adjacent ceramic layer greater than 10N/mm results in order to achieve high flexural and breaking strength. Also, to prevent damage or cracks in the respective adjacent ceramic layer, especially in the case of strains due to changing temperatures, the metal of the inner metal layer has a Brinell hardness of less than 75, preferably a Brinell hardness of less than 40.

The metal-ceramic substrate formed in this manner has a breaking strength that is substantially greater, but at least greater by a factor of 1.5, than the breaking strength of a single ceramic layer with a layer thickness that is equal to the layer thickness of the two separated ceramic layers of the substrate according to the invention.

Further, the metal-ceramic substrate according to the invention has an electric or dielectric strength that is substantially greater than, but at least greater by a factor of 1.4, than the electric or dielectric strength of a substrate with only one ceramic layer whose layer thickness is equal to the sum of the layer thickness of the two separated ceramic layers of the substrate according to the invention. In the substrate according to the invention, electric field strengths of at least 18 kV/mm are possible within the ceramic layers with a layer thickness of approximately 0.3 mm before an electric breakdown occurs.

Further embodiments, advantages and applications of the invention are also disclosed in the following description of exemplary embodiments and the drawings. All characteristics described and/or pictorially represented, alone or in any combination, are subject matter of the invention, regardless of their being summarized or referenced in the claims. The content of the claims is also an integral part of the description.

BRIEF DESCRIPTION OF THE DRAWINGS

The invention is described in more detail below based on exemplary embodiments, in which:

FIG. 1 shows a simplified cross-section view of a metal-ceramic substrate according to the invention;

FIGS. 2 and 3 show measuring set-ups for determining the breaking strength of the metal-ceramic substrate according to the invention or for determining the adhesive or peel strength between an inner metal layer and the adjacent ceramic layer;

FIGS. 4-7 respectively show a cross-section view of a metal-ceramic substrate of different embodiments of the invention;

FIGS. 8 and 9 respectively show an enlarged partial cross-section view of further metal-ceramic substrates according to the invention.

DETAILED DESCRIPTION OF THE INVENTION

Figure 9:
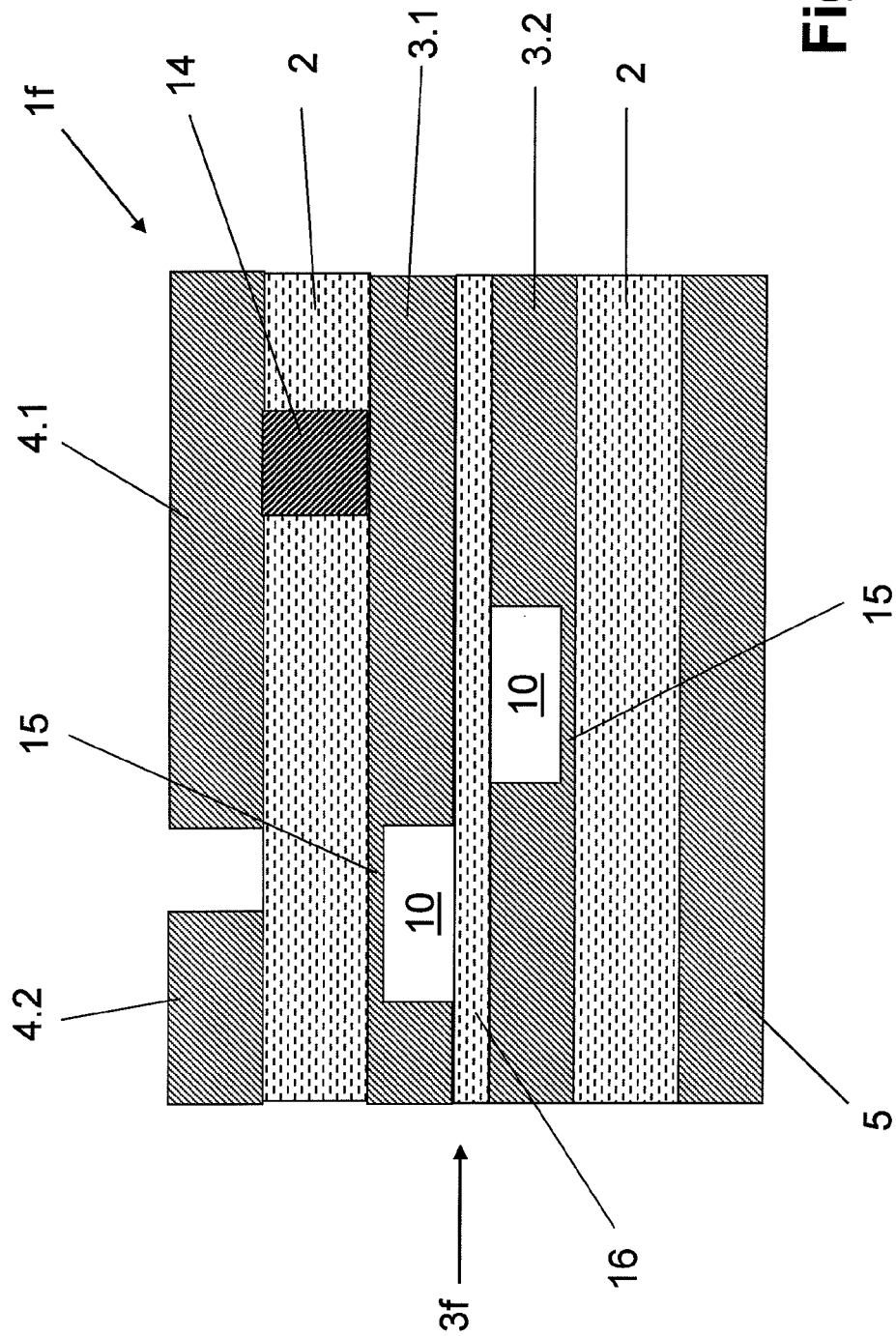

The metal-ceramic substrate with improved mechanical, thermal and electrical properties 1 in FIG. 1 consists essentially of two flat, plate-shaped ceramic layers 2, an intermediate layer 3 in the form of a single inner metal layer 3.1, provided between these ceramic layers 2, and respectively connected two-dimensionally with the mutually facing surface sides of the ceramic layer and of two outer, metallizations in the form of metal layers 4 and 5 applied to the surface sides of the ceramic layers 2 facing away from each other. The metal layers 3, 4 and 5 are preferably metal foils and/or metal layers of copper, a copper alloy or aluminum.

The ceramic layers 2 consist of a suitable ceramic for metal-ceramic substrates, for example of Al2O3, Al2O3-ZrO2, AlN and/or Si3N4. To achieve a symmetrical design of the metal-ceramic substrate 1 in relation to a substrate middle plane parallel to the surface sides of the ceramic layers 2 and extending in the middle between these layers, at least thermally and therefore to prevent a bi-metal effect in case of thermal loads on the metal-ceramic substrate 1, the ceramic layers 2 preferably are of the same ceramic with the same layer thickness d2. Further, the outer metal layers 4 and 5, which with their surface sides facing away from the respectively adjacent ceramic layer 2 form the top side (metal layer 4) and the bottom side (metal layer 5) of the metal-ceramic substrate 1, preferably have the same thickness d4 and d5 (d4=d5). Principally, however, other embodiments are also conceivable, especially if a symmetrical design of the metal-ceramic substrate 1 relative to the substrate middle plane is not desired or required.

The ceramic layers 2 are connected with the metal layers 3.1, 4 and 5 preferably using the DCB process, i.e. by DCB bonding or by active soldering. The manufacture of the substrate takes place in a single processing step, in which the stack, consisting of the two ceramic layers 2, the inner metal layer 3.1 and the two outer metal layers 4 and 5 is connected to the metal-ceramic substrate 1 by DCB bonding or by active soldering. Principally, the metal-ceramic substrate 1 can also be manufactured in several, temporally successive processing steps, for example in the manner that in a first processing step each ceramic layer 2 is provided with the metal layer 4 or 5 only on one surface side, e.g. by DCB bonding or active soldering. In a further processing step the two ceramic layers 2 are brought with their surface side facing away from the metal layer 4 or 5 respectively into contact with the middle metal layer 3.1 and connected with this layer by DCB bonding or active soldering.

The two ceramic layers 2 and the inner metal layer 3.1 form a substrate body with a substantially greater thickness compared with the thickness d4 and d5 of the outer metal layers 4 and 5 that is equal to the sum of twice the thickness d2 of the ceramic layers 2 and the thickness d3.1 of the middle metal layer 3.1.

The layer thickness d2 of the ceramic layer 2 is between approximately 0.2 and 1.3 mm. The layer thickness d3.1 of the inner metal layer 3 is approximately between 0.1 and 0.8 mm and the layer thicknesses d4 and d5 of the outer metal layers 3 and 4 are likewise between approximately 0.1 and 0.8 mm. The layer thicknesses d4 and d5 can also deviate from this, however, depending on the respective application of the metal-ceramic substrate 1.

In practice, at least the top metal layer 4 is structured in the manner known to persons skilled in the art in order to form metal layer areas that are electrically insulated from each other, i.e. in order to form electric contact surfaces, strip conductors or connections, by mechanical processing or using the masking and etching technology known to persons skilled in the art.

As a result of the construction depicted in FIG. 1 and described above, the metal-ceramic substrate 1, in comparison with conventional metal-ceramic substrates which consist of a single ceramic layer with double-sided metallization, surprisingly has substantially improved mechanical, thermal and electrical properties. For example, the metal-ceramic substrate 1 has a higher flexural strength and an improved breaking strength by at least a factor of 1.5 compared with the breaking strength of one of the ceramic layers 2.

The breaking strength s is determined with the three-point load test schematically depicted in FIG. 2. In this test, the test piece 6, which is rectangular when viewed from above and which for example is one of the two ceramic layers 2 or the metal-ceramic substrate 1 itself, is placed at both ends, i.e. in the proximity of its narrow sides, on supports 7, which respectively extend perpendicular to the longitudinal sides of the test piece 6 and are parallel and separated from each other. A force F is then applied to the test piece 6 on its top side in the middle between the supports 7 by means of a further support 7 or a wedge-shaped die. The specific breaking strength s is then determined based on the following formula:

$$s = 1.5 \times F \times L / B \times d6,$$

where
F is the force in newtons at which after initial elastic deformation of the test piece 6 breakage of the test piece occurs;
L is the distance in millimeters of the two support areas in the longitudinal direction of the test piece 6 from the lower supports 7;
B is the width in millimeters of the test piece 6 perpendicular to its longitudinal extension and d6 is the thickness in millimeters of the test piece 6.

The specific breaking strength of the pure ceramic is greater than 400 N/mm$^2$, which also corresponds to the breaking strength of a conventional metal-ceramic substrate with only one ceramic layer, since the metal layers applied on both sides contribute only minimally to increasing the specific breaking strength. Measurements have confirmed that the specific breaking strength of the metal-ceramic substrate 1 is substantially higher, i.e. at least by a factor of 1.5 than the specific breaking strength of a metal-ceramic substrate with only one ceramic layer whose layer thickness is equal to the sum of the layer thicknesses d2.

To achieve the increased specific breaking strength it is necessary or at least expedient, according to a basic principle of the invention, that the connection at least between the inner metal layer 3.1 and the adjacent ceramic layers 2 is executed with sufficiently high adhesive or peel strength. The adhesive or peel strength is measured in the manner depicted in FIG. 3 on a test piece 8 that consists of a ceramic layer 2 and the metal layer 3.1 bonded to this ceramic layer, namely in the manner that the metal layer 3.1 is pulled off with a force F in an axial direction perpendicular to the plane of the surface side of the ceramic layer 2. The metal layer 3.1 is strip-shaped with a width of 50 mm and a thickness of 0.5 mm. The adhesive or peel strength is the quotient from the minimum force F (in N) that is needed to remove the metal layer 3.1 from the ceramic layer 2 and the width (in mm) of the metal layer 3.

To achieve the increased breaking strength s1 described above for the metal-ceramic substrate 1, an adhesive or peel strength greater than 10 N/mm is needed according to a basic principle of the invention.

Further, the metal-ceramic substrate 1 also has improved thermal properties. These properties are due in part to the fact that the metal-ceramic substrate 1 features high resistance to temperature changes. The metal-ceramic substrate is also stable in the case of frequent and high or extreme changes in temperature, i.e. in particular no damage occurs that would impair the properties of the metal-ceramic substrate 1 and especially not the mechanical and electrical properties (especially the electric strength), for example cracks in the ceramic layers 2, despite the different thermal expansion coefficients of ceramic and metal or copper. Frequent and extreme temperature changes in the metal-ceramic substrate 1 occur if this substrate is used as the base or board for electric circuits or modules with high power, for example, for switching drives or other consumers with high power. To achieve this high thermal stability, the invention provides for a Brinell hardness for the metal of the metal layers 3.1, 4 and 5 when used in an application that is less than 75 and preferably (especially when aluminum is used) less than 40.

Improved thermal properties for the metal-ceramic substrate 1, surprisingly, are also achieved by the fact that the inner metal layer 3 acts as a thermal spreader. For better understanding it is noted that when used in an application the upper metal layer 4 is structured so that a metal layer area of this metal layer forms a contact or mounting surface for an electrical or electronic power component that dissipates heat during operation, as indicated in FIG. 1 with the arrow W. This dissipated heat W is further transferred by the upper ceramic layer 2 into the inner metal layer 3.1, in which lateral distribution, or spreading, of the dissipated heat occurs, as indicated in FIG. 1 with the arrows W'. The dissipated heat is therefore further transferred from the entire or nearly the entire surface of the metal layer 3.1 on a large cross section through the lower ceramic layer 2 to the lower metal layer 5 or to a cooler (not depicted) that is at least thermally connective to this metal layer.

Further, the metal-ceramic substrate 1 also has improved electrical properties. The substrate has improved avoidance of thermally related faults or cracks in the ceramic layers 2 in case of changing temperatures due to a corresponding choice of the metal hardness for the metal layers 3, 4 and 5 and the avoidance of a reduction of the electric strength of the metal-ceramic substrate by such faults.

It has also been shown that the reduced hardness of the metal layers 3.1, 4 and 5 especially in the case of DCB bonding, but also in the case of active soldering, is a major advantage, since due to the reduced hardness of the metal layers 3, 4 and 5 during cooling of the metal-ceramic substrate, after bonding, from the high process temperature (approximately 1025° C. to 1083° C., or approximately 800° C.-1000° C. in the case of active soldering) to the ambient temperature, thermally related cracks in the ceramic layers 2 that affect the electric strength of the metal-ceramic substrate do not occur.

Further, it has surprisingly been shown that due to the structure of the metal-ceramic substrate 1, the electric strength of this substrate can be increased substantially, namely to a value that is substantially greater than the electric strength exhibited by a ceramic layer with a layer thickness that is equal to the sum of the layer thicknesses d2.

Electric strength in this respect means that in the case of an external electrical DC voltage applied to the metal layers 4 and 5, the electric field strength present in the ceramic layers 2 just at which an electric breakdown does not yet take place, i.e. in particular the partial discharge is still below a predefined threshold value. In the case of a single ceramic layer with a layer thickness of approximately 0.64 mm this field strength defining the electric or dielectric strength is at least 10 kV/mm. In the event that two ceramic layers 2 are used with a respective layer thickness of 0.32 mm in the metal-ceramic substrate 1, the field strength defining the electric strength or breakdown strength is at least 18 kV/mm. This means that the electric strength of the metal-ceramic substrate 1 in the case of equal total thickness of the ceramic layers 2 is greater by at least a factor of 1.4 in comparison with a metal-ceramic substrate with only one ceramic layer that has twice the layer thickness d2 of the ceramic layer 2.

The increase in the breaking strength of the metal-ceramic substrate 1 in comparison with a metal-ceramic substrate that has only a single ceramic layer, however with twice the thickness d2, is due to the middle intermediate layer 3 separating the two ceramic layers 2 from each other. The layer thickness of this intermediate layer is selected to result in a breaking strength for the metal-ceramic substrate 1 that is increased by at least a factor of 1.5.

FIG. 4 shows as a further embodiment a metal-ceramic substrate 1a, which differs from the metal-ceramic substrate 1 of FIG. 1 essentially in that the middle intermediate layer 3a, corresponding to the intermediate layer 3, is multi-layered, namely consisting of the metal layer 3.1 and a further metal layer 3.2. The two metal layers 3.1 and 3.2, of which the metal layer 3.1 is connected with the bottom side of the upper ceramic layer 2 in FIG. 4 and the metal layer 3.2 is connected with the top side of the lower ceramic layer 2 in FIG. 4, namely by means of DCB bonding or active soldering, are connected two-dimensionally with each other by means of a connecting layer 9. The connecting layer 9 is made of hard solder, for example a hard solder with a melting point higher than 300° C. The two metal layers 3.1 and 3.2, both respectively, have the layer thickness d3 so that the two ceramic layers 2 of the metal-ceramic substrate 1a are separated even further from each other than in the metal-ceramic substrate 1. As a result of this, this metal-ceramic substrate 1a, in comparison with the preferred metal-ceramic substrate 1, has an even higher flexural rigidity and breaking strength. Due to the greater layer thickness of the multi-layer intermediate layer 3a, in comparison with the intermediate layer 3 of the preferred embodiment, the thermal spreading effect is also improved.

The manufacture of the metal-ceramic substrate 1a is accomplished in the manner that the two ceramic layers 2 are provided on both sides with the metallization 3.1 and 4 and 3.2 and 5 respectively, for example using the DCB process or the active soldering process. The sub-substrates are manufactured in this manner and are connected with each other on the metal layers 3.1 and 3.2 by means of the connecting layer 9.

FIG. 5 shows as a further embodiment a metal-ceramic substrate 1b, which differs from the metal-ceramic substrate 1a previously described essentially only in that the two metal layers 3.1 and 3.2, which form the multi-layer intermediate layer 3b separating the two ceramic layers 2 from each other, are connected with each other by DCB bonding, so that the connecting layer 9 is eliminated.

FIG. 6 shows as a further embodiment a metal-ceramic substrate 1c, which differs from the preferred metal-ceramic substrate 1b firstly in that the middle metal layer 3c separating the two ceramic layers 2 from each other has three layers, namely consisting of the metal layers 3.1, 3.2 and 3.3, which are connected with each other by DCB bonding, active soldering or hard soldering and of which the metal layer 3.1 is connected with the bottom side of the upper ceramic layer 2 in FIG. 6 and the metal layer 3.2 is connected with the top side of the lower ceramic layer 2 in FIG. 6, namely respectively by means of DCB bonding or active soldering.

As depicted in FIG. 6, the metal layers 3.1 and 3.2 are structured, so that chambers or channels or recesses 10 are formed within these metal layers, namely for receiving gaseous, vaporous or liquid components released during connecting or bonding, for receiving excess connecting or bonding material, e.g. solder.

In order not to impair the mechanical and thermal properties of the metal-ceramic substrate 1c, i.e. in order not to impair the desired high breaking strength and the desired low thermal resistance between the top side and the bottom side of the metal-ceramic substrate 1c, the recesses 10 provided in the metal layers 3.1 and 3.2 are offset from each other, i.e. arranged so that they do not overlap.

The metal layer 3.3 is depicted as continuous, i.e. without recesses 10. Of course, corresponding recesses can also be provided in this layer. The upper metal layer 4 in this embodiment is structured, namely for forming metal layer areas 4.1 and 4.2 that are electrically insulated from each other.

The manufacture of the metal-ceramic substrate 1c is accomplished so that first the ceramic layers 2 are provided on their surfaces sides with the metal layers 3.1 and 4 and 3.2 and 5 respectively, for example by DCB bonding or active soldering, and that then the resulting sub-substrates with their metal layers 3.1 and 3.2 are connected with each other by means of the metal layer 3.3 using a suitable bonding medium, e.g. hard solder. Other bonding processes, for example DCB bonding or active soldering are also possible for connecting the metal layers 3.1 and 3.2 with the metal layer 3.3.

FIG. 7 shows as a further embodiment a metal-ceramic substrate 1d, in which the middle intermediate layer 3d separating the two ceramic layers 2 from each other likewise is formed by the two metal layers 3.1 and 3.2 that are two-dimensionally connected with each other. On the surface side facing away from the intermediate layer 3d the ceramic layers 2 are provided with the metal layer 4 and 5. Thus far the metal-ceramic substrate 1d corresponds to the metal-ceramic substrate 1b. However, in the case of the metal-ceramic substrate 1d the metal layers 3.1 and 3.2 are likewise structured for forming the recesses 10, which serve to receive corresponding gaseous, vaporous or liquid components accumulating during bonding for receiving excess bonding medium. Further, the metal layer 4 on the top side of the metal-ceramic substrate 1d is structured to form metal layer areas 4.1, 4.2 and 4.3 that are electrically insulated from each other, the metal layer area 4.1 serving as a mounting surface for an electric or electronic power element or module 11, which for example is an IGBT (Insulated Gate Bipolar Transistor) and is connected at least thermally with the metal layer area 4.1. On the metal layer area 4.2 and 4.3, further electrical or electronic components 12 and 13 are provided, which likewise are connected at least thermally, but preferably also electrically with these metal layer areas. The components 12 and 13 are for example actuator or driver circuits or modules, diodes, resistors, etc.

FIG. 8 shows in an enlarged partial depiction a cross section through a metal-ceramic substrate 1e, which is essentially identical to the metal-ceramic substrate 1d, however first with the difference that the metal layer area 4.1 on the top side of the substrate is connected mechanically, thermally and electrically via an opening in the upper ceramic layer 2 and by a through-hole contact 14 formed via this opening with the metal layer 3.1 and via the latter also with the metal layer 3.2. The through-hole contact 14 consists of a metal material, preferably the material at least of the metal layers 3.1 and 4, but preferably also the material of all metal layers 3.1, 3.2, 4 and 5.

As FIG. 8 further shows, the two metal layers 3.1 and 3.2 are designed to form the recesses 10 so that although the latter extend as far as the connecting plane between the metal layers 3.1 and 3.2, they do not extend directly to the respective adjacent ceramic layer 2, i.e. each recess 10 has a bottom 15, which is formed by an area of the corresponding metal layer 3.1 or 3.2 with a substantially reduced thickness and therefore separates the interior space of the respective recess 10 from the adjacent ceramic layer 2.

Preferably also other metal-ceramic substrates are designed in this manner with respect to the channels or chambers or recesses 10, for example, metal-ceramic substrates 1c and 1d.

The manufacture of the metal-ceramic substrate 1e likewise is accomplished preferably in the form that first the two sub-substrates consisting of a ceramic layer 2 and the metal layers 3.1 and 4 and 3.2 and 5 respectively, namely with the at least one through-hole contact 14, that the structuring of the metal layers 3.1 and 3.2 for forming channels or chambers 10 and the structuring of at least the metal layer 4 for forming the metal layer areas 4.1, 4.2, 4.3 etc. then takes place, namely using a suitable technique, e.g. etching and masking and/or by mechanical processing. The sub-substrates manufactured in this manner are then connected with each other on the metal layers 3.1 and 3.2, for example by DCB bonding, active soldering or hard soldering or using another suitable bonding means. The recesses 10 are open on the surface side of the sub-substrates on which the connecting of these sub-substrates to the metal-ceramic substrate 1e takes place.

FIG. 9 shows as a further embodiment a metal-ceramic substrate 1f, which differs from the metal-ceramic substrate 1e only in that the middle multi-layered intermediate layer 3f separating the two ceramic layers 2 from each other comprises in addition to the two metal layers 3.1 and 3.2 an insulating layer 16, in the depicted embodiment a thin insulating layer, provided between these metal layers. The insulating layer 16 is for example likewise a ceramic layer. In the depicted embodiment the recesses 10 are directly adjacent to the insulating layer 16.

The manufacture of the metal-ceramic substrate if is accomplished in an analogous manner to the manufacture of the preferred metal-ceramic substrate 1e, namely in the form that first the two sub-substrates are manufactured from the ceramic layer 2 and the metal layers 3.1 and 4 and 3.2 and 5 with the through-hole contact 14 and then, for forming the recesses 10 and the metal layer areas 4.1, 4.2, 4.3 etc are structured, namely using a suitable technique, e.g. etching and masking or by mechanical processing. Afterwards the connecting of the sub-substrates with their sub-layers 3.1 and 3.2 by means of the insulating layer 16 takes place using a suitable bonding process, for example DCB bonding or active soldering. The recesses 10 are likewise open on the surface side of the sub-substrates on which the connecting of these sub-substrates to the metal-ceramic substrate if by means of the insulating layer 16 takes place.

While the intermediate layers 3, 3a-3d in the metal-ceramic substrates 1, 1a-1d serve only to separate the two ceramic layers 2, the intermediate layers 3e and 3f also have an electrical function due to the at least one through-hole contact 14, i.e. the intermediate layer 3e and the metal layer 3.1 of the intermediate layer 3f function as a connection or electrical connection.

The ceramic of the ceramic layers 2 of the metal-ceramic substrates 1a-1f is preferably Al2O3, Al2O3-ZrO2, AlN or Si3N4 and they have a layer thickness d2 between approximately 0.2 mm and 1.3 mm. The metal layers 3.1, 3.2, 3.3, 4 and 5 are layers of copper or a copper alloy. Other metal materials for these metal layers are also principally possible, preferably aluminum or aluminum alloys. The layer thicknesses d3.1 and d3.2 of the metal layers 3.1 and 3.2 are between 0.1 mm and 0.8 mm, likewise the layer thickness d3.3 of the metal layer 3.3 or the layer thicknesses d4 and d5 of the outer metal layers 3 and 4.

The total thickness of the intermediate layer 3a-3f separating the two ceramic layers 2 from each other in the metal-ceramic substrates 1a-1f is selected so that the respective metal-ceramic substrate 1a-1f has the required flexural strength as well as the breaking strength, which is substantially greater than the breaking strength of a single ceramic layer whose layer thickness is equal to the sum of the layer thicknesses d2 of the two ceramic layers 2, namely at least by a factor of 1.5. Further, the adhesive or peel strength of the connection at least between the respective ceramic layer 2 and the adjacent metal layer 3.1 or 3.2 in the metal-ceramic substrate 1a-1f is at least 10 N/mm, namely with reduced metal hardness at least of the metal layers 3.1 and 3.2, and preferably also of the metal layers 3.3, 4 and 5, i.e. with a Brinell hardness of less than 75, preferably less than 40.

The metal-ceramic substrates for all alternative preferred embodiments 1a-1f exhibit the same improved mechanical, thermal and electrical properties as those described for the metal-ceramic substrate 1, i.e. high flexural strength and breaking strength, high thermal spreading in the intermediate layer 3a-3f, high resistance to changing temperatures (also enhanced by the reduced metal hardness of the metal layers) as well as improved electrical properties, especially with respect to the electric and dielectric strength. This is better at least by a factor of 1.4 in comparison with a metal-ceramic substrate with a single ceramic layer whose layer thickness corresponds to the sum of the layer thicknesses d2 of the ceramic layers 2.

In the metal-ceramic substrates 1a-1f the metal layers 4 and 5 form with their surface sides facing away from the respective adjacent ceramic layer 2 the top side (metal layer 4) and bottom side (metal layer 5) of the metal-ceramic substrate 1.

Also the metal-ceramic substrates 1a-1f are preferably, at least with respect to thermal properties, symmetrical or essentially symmetrical to the substrate middle plane extending in the middle between the substrate top side and the substrate bottom side and extending parallel to these sides, so that in the case of temperature changes a bi-metal effect the causing the substrate to arch does not occur. Preferably the metal-ceramic substrates 1a-1f are symmetrical or essentially symmetrical to the substrate middle plane with respect to the number and type of layers, the layer thicknesses and the materials used for the layers.

The invention was described above based on exemplary embodiments. It goes without saying that numerous modifications and variations are possible without abandoning the underlying inventive idea upon which the invention is based.

It was assumed in the foregoing description, for example, that the connecting or bonding of the different metal layers 3.1, 3.2, 3.3, 4, 5 with each other or with the adjacent ceramic layers 2 is achieved by means of DCB bonding, active soldering or hard soldering. Principally, adhesive connections or adhesive techniques using synthetic adhesives, for example using adhesives with an epoxy resin base, can be used for the bonding, namely in particular fiber-reinforced adhesives, which then, due to their fiber content, reduce the thermal expansion of adjacent metal layers and therefore further improve the resistance to temperature changes.

Suitable adhesives for this are especially adhesives that contain carbon fibers, carbon nanofibers, carbon nanotubes or adhesives with which a good thermally or electrically conductive connection is possible.

Preferably a synthetic material (e.g. epoxy resin) is used for the adhesive, which is stable for at least 5 minutes at the soldering temperature used for bonding component parts to substrates or printed circuit boards, for example 350° C. Since during soldering the respective soldering temperature is applied only temporarily, a temperature resistance of the adhesive used as the bond material lower than the soldering temperature, for example lower than 350° C., is principally sufficient, a temperature resistance of at least 220° C.

In the case of the metal-ceramic substrates 1a-1f described above, the respective intermediate layer 3, 3a-3f is continuous in design. Even if this is the preferred embodiment, embodiments are also conceivable in which the intermediate layer separating the ceramic layers consists of several areas or sections.

REFERENCE LIST 1, 1a-1f metal-ceramic substrate
2 ceramic layer
3, 3a-3f intermediate layer for separation of the ceramic layers 2
3.1-3.3 metal layer
4.5 metal layer
4.1-4.3 metal layer area
6 test sample
7 support
8 test sample
9 connecting or bond layer
10 recesses
11 electric or electronic power component or module
12, 13 electric or electronic component
14 through-hole contact
15 bottom
16 insulating layer
F force exerted on the test piece 6 or 8
W thermal energy brought into the metal-ceramic substrate
W' thermal spreading
L distance between the support surfaces
B width of the test piece 6
M substrate middle plane

The invention claimed is:

1. A metal-ceramic substrate for a printed circuit board achieving improved mechanical, thermal and electrical properties, comprising:
a first outer metal layer forming a first surface side of the metal-ceramic substrate and a second outer metal layer forming a second surface side of the metal-ceramic substrate, the first outer metal layer and the second outer metal layer being bonded by two-dimensional bonding with surface sides of a plate-like substrate body, wherein the plate-like substrate body comprises at least two ceramic layers to which the first outer metal layer and the second outer metal layer are bonded and an intermediate layer provided between the at least two ceramic layers and separating the at least two ceramic layers from each other, wherein the intermediate layer comprises at least two inner metal layers connected with each other two-dimensionally by bonding and an inner insulating layer is provided between the at least two inner metal layers, and wherein the at least two inner metal layers extend essentially over an entire surface side of the at least two ceramic layers adjacent to the intermediate layer and are bonded two-dimensionally continuously and without interruption to the at least two ceramic layers by DCB-bonding or active solder bonding, and wherein the at least two inner metal layers are bonded two-dimensionally continuously and without interruption to each other by solder bonding or adhesive bonding and the at least two inner metal layers are structured to form channels or recesses that are offset from one another for receiving, within the at least two inner metal layers, gaseous, vaporous or liquid components released during the solder bonding or the adhesive bonding, and wherein the intermediate layer has a Brinell hardness of less than 75.

2. The metal-ceramic substrate for a printed circuit board according to claim 1, wherein a layer thickness of the intermediate layer is at least equal to or greater than a layer thickness of the first outer metal layer or the second outer metal layer or is greater than a layer thickness of at least one of the at least two ceramic layers.

3. The metal-ceramic substrate for a printed circuit board according to claim 1, wherein the metal-ceramic substrate has a breaking strength that is greater than a breaking strength of a single ceramic layer whose layer thickness is equal to a sum of the layer thicknesses of the at least two ceramic layers separated from each other by the intermediate layer.

4. The metal-ceramic substrate for a printed circuit board according to claim 1, wherein the at least two inner metal layers are connected with a respective adjacent ceramic layer with an adhesive or peel strength greater than 10N/mm.

5. The metal-ceramic substrate for a printed circuit board according to claim 1, wherein the at least two ceramic layers are separated from each other by at least one through-hole contact, the at least one through-hole contact connects the first outer metal layer or a metal layer area of the first outer metal layer mechanically, thermally or electrically with one of the at least two inner metal layers.

6. The metal-ceramic substrate for a printed circuit board as claimed in claim 1, having an electric or dielectric strength of at least 18 kV/mm.

7. The metal-ceramic substrate for a printed circuit board according to claim 1, wherein the at least two ceramic layers are composed of Al2O3, Al2O3-ZrO2, AlN, Si3N4 or a combination thereof.

8. A metal-ceramic substrate for a printed circuit board achieving improved mechanical, thermal and electrical properties, comprising:
a first outer metal layer forming a first surface side of the metal-ceramic substrate and a second outer metal layer forming a second surface side of the metal-ceramic substrate, the first outer metal layer and the second outer metal layer being bonded by two-dimensional bonding with surface sides of a plate-like substrate body, wherein the plate-like substrate body comprises at least two ceramic layers to which the first outer metal layer and the second outer metal layer are bonded and an intermediate layer provided between the at least two ceramic layers and separating the at least two ceramic layers from each other, wherein the intermediate layer comprises at least two inner metal layers connected with each other two-dimensionally by bonding and an inner insulating layer is provided between the at least two inner metal layers, and wherein the at least two inner metal layers extend essentially over an entire surface side of the at least two ceramic layers adjacent to the intermediate layer and are bonded two-dimensionally continuously and without interruption to the at least two ceramic layers by DCB-bonding or active solder bonding, and wherein the at least two inner metal layers are bonded two-dimensionally continuously and without interruption to each other by solder bonding or adhesive bonding and wherein the at least two ceramic layers are separated from each other by at least one through-hole contact, the at least one through-hole contact connects the first outer metal layer or a metal layer area of the first outer metal layer mechanically, thermally or electrically with one of the at least two inner metal layers and wherein the at least two inner metal layers are structured to form channels or recesses that are offset from one another for receiving, within the at least two inner metal layers, gaseous, vaporous or liquid components released during the solder bonding or the adhesive bonding.

9. The metal-ceramic substrate for a printed circuit board according to claim 8, wherein a layer thickness of the intermediate layer is at least equal to or greater than a layer thickness of the first outer metal layer or the second outer metal layer or is greater than a layer thickness of at least one of the at least two ceramic layers.

10. The metal-ceramic substrate for a printed circuit board according to claim 8, wherein the metal-ceramic substrate has a breaking strength that is greater than a breaking strength of a single ceramic layer whose layer thickness is equal to a sum of the layer thicknesses of the at least two ceramic layers separated from each other by the intermediate layer.

11. The metal-ceramic substrate for a printed circuit board according to claim 8, wherein the at least two inner metal layers are connected with a respective adjacent ceramic layer with an adhesive or peel strength greater than 10N/mm.

12. The metal-ceramic substrate for a printed circuit board as claimed in claim 8, having an electric or dielectric strength of at least 18 kV/mm.

13. The metal-ceramic substrate for a printed circuit board according to claim 8, wherein the at least two ceramic layers are composed of Al2O3, Al2O3-ZrO2, AlN, Si3N4 or a combination thereof.

\* \* \* \* \*